(12) United States Patent
Courtice (10) Patent No.: US 9,888,094 B2
(45) Date of Patent: Feb. 6, 2018

(54) DATA COMPRESSION AND DECOMPRESSION METHODOLOGY AND APPARATUS

(71) Applicant: COOPER TECHNOLOGIES COMPANY, Houston, TX (US)

(72) Inventor: Harry John Courtice, Windsor (AU)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 220 days.

(21) Appl. No.: 14/754,777

(22) Filed: Jun. 30, 2015

(65) Prior Publication Data

US 2015/0381774 A1    Dec. 31, 2015

Related U.S. Application Data

(60) Provisional application No. 62/018,732, filed on Jun. 30, 2014.

(51) Int. Cl.
| | |
|---|---|
| *H04B 7/00* | (2006.01) |
| *H04L 29/06* | (2006.01) |
| *H04L 1/00* | (2006.01) |
| *H03M 7/30* | (2006.01) |
| *H04L 1/16* | (2006.01) |

(52) U.S. Cl.
CPC ............. *H04L 69/04* (2013.01); *H03M 7/30* (2013.01); *H03M 7/3088* (2013.01); *H03M 7/6005* (2013.01); *H03M 7/6058* (2013.01); *H04L 1/00* (2013.01); *H04L 1/16* (2013.01)

(58) Field of Classification Search
CPC . H04L 69/22; H04L 1/00; H04L 69/04; H04L 1/16; H04W 28/06; H03M 7/3088; H03M 7/6058; H03M 7/30; H03M 7/6005
See application file for complete search history.

(56) References Cited

U.S. PATENT DOCUMENTS

| | | | | |
|---|---|---|---|---|
| 5,502,439 A | * | 3/1996 | Berlin ................. | H03M 7/3086 341/106 |
| 5,805,086 A | * | 9/1998 | Brown ................ | H03M 7/3086 341/50 |

(Continued)

*Primary Examiner* — Ayaz Sheikh
*Assistant Examiner* — Hai-Chang Hsiung
(74) *Attorney, Agent, or Firm* — Eckert Seamans; Brij Agarwal; Philip Levy (57) ABSTRACT

A data compression/decompression methodology and system stores in a compression-side dictionary the data that has been transmitted and additionally applies to such data in the compression-side dictionary a status of being "invalid" for purposes of use as a reference in data compression until an acknowledgement signal has been received from the decompression side indicating that such data has been received. Once the compression side has received the acknowledgement signal indicating that the data in the form of a compressed data packet has been received on the decompression side, the status is changed from being "invalid" into being "valid", i.e., into being usable as reference data for use in compressing further data elements in the data stream. Each data packet includes a stream index which is representative of the memory location in the compression-side dictionary where the first data element of the uncompressed data set of the data packet is stored.

14 Claims, 10 Drawing Sheets

(56) References Cited

U.S. PATENT DOCUMENTS

2012/0221576 A1* 8/2012 Marquardt ........ G06F 17/30144
707/741
2014/0223030 A1* 8/2014 Bhaskar .............. H03M 7/3088
709/247

* cited by examiner

DATA COMPRESSION AND DECOMPRESSION METHODOLOGY AND APPARATUS

CROSS-REFERENCE TO RELATED APPLICATION

The instant application claims priority from U.S. Provisional Patent Application No. 62/018,732 filed Jun. 30, 2014, the disclosures of which are incorporated herein by reference.

BACKGROUND

Field

The disclosed and claimed concept relates generally to data processing systems and, more particularly, to a data compression and decompression system that is usable as part of a wireless data communication apparatus.

Related Art

Most computerized systems employ the communication of data from one location to another in order to perform operations. Within a computer, the communication of data typically occurs across a data bus, such as when data is communicated between a processor and a storage. It is also well known to wirelessly communicate data from one location to another separate location using any of a wide variety of data protocols.

In nearly all applications, the bandwidth of data communication is limited by one or more constraints. Wireless data communication systems are notoriously subject to such bandwidth limitations. A number of methodologies have been developed to alleviate the effects of such bandwidth limitations that are applicable both in wireless and in wired applications. One solution has involved data compression and subsequent decompression wherein data is compressed using any of a variety of data compression algorithms. Compressed data is then wirelessly transmitted as one or more data packets to another location where the data packets are then decompressed to obtain the original data content. While such data compression/decompression methodologies and systems have been generally effective for their intended purposes, they have not been without limitation.

Several commonly used data compression/decompression methodologies involve comparing a stream of data with previously-communicated streams of data in order to find target strings of data elements that are identical to previously-sent reference strings of data elements. If such an identity is found, the target string of data that otherwise would be transmitted is instead simply replaced with a reference to the reference data string. In order to make such a system work, however, it is typically necessary to maintain a history of past data transmissions or a "dictionary" on both the compression side and the decompression side in order to store previously-communicated data. This enables the decompression algorithm to find the previously-communicated reference string on the decompression side and to replace the communicated reference to that reference string with the previously-communicated reference string itself. Limitations have been encountered, however, with the use of such a dictionary because data storage capabilities typically are limited, and the "dictionary" on each of the compression and decompression sides must likewise be even further limited. Moreover, the sending of a compressed data packet does not always mean that the data packet is received on the decompression side. Such data packets have been known to be lost or delivered out of sequence, and increasing the size of the "dictionary" on the compression and/or decompression sides is not always practical or even possible.

Some attempts have been made to overcome the shortcomings known in the relevant art. Such attempts have included completely erasing the dictionaries on the compression and decompression sides in the event of a lost or delayed data packet. Other solutions have involved the use of a history vector that is at the beginning of each packet, but the transmission overhead required to communicate such a vector increases linearly with the size of the history buffer that is used, which makes this method somewhat inefficient in certain circumstances. It thus would be desirable to provide a solution that overcomes certain shortcomings in the relevant art.

SUMMARY

An improved data compression/decompression methodology and system stores in a compression-side dictionary the data that has been transmitted and additionally applies to such data in the compression-side dictionary a status of being "invalid" for purposes of use as a reference in data compression until an acknowledgement signal has been received from the decompression side indicating that such data has been received. Once the compression side has received the acknowledgement signal indicating that the data in the form of a compressed data packet has been received on the decompression side, the status is changed from being "invalid" into being "valid", i.e., into being usable as reference data for use in compressing further data elements in the data stream. Each data packet includes a stream index which is representative of the memory location in the compression-side dictionary where the first data element of the uncompressed data set that is represented by the data packet is stored. The stream index is used on the decompression side to determine the location in a decompression-side dictionary storage array where the received data packet (as decompressed) should be stored. With the use of the stream index, data packets can be received in any order and stored at the correct sequential location in the decompression-side dictionary.

Accordingly, an aspect of the disclosed and claimed concept is to provide an improved system and method for compression/decompression data transfer.

Another aspect of the disclosed and claimed concept is to provide an improved compression/decompression data transfer method and apparatus that provide improved performance without requiring correspondingly increased data storage.

Accordingly, as aspect of the disclosed and claimed concept is to provide an improved method of communicating at least a portion of a data stream between a first location and a second location. The method can be generally stated as including, for each uncompressed data set of a number of uncompressed data sets of the data stream, sequentially storing in a storage a number of data elements of the uncompressed data set, a first data element of the number of data elements being stored at a given location in the storage, storing in the storage an indication that the number of data elements each have a first status assigned thereto, subjecting the number of data elements to a data compression routine to form from the uncompressed data set a corresponding compressed data packet, which can be generally stated as including determining that a string of data elements of the number of data elements is identical to a string of other data elements of the data stream that are stored in the storage and to which a second status has been assigned and, responsive thereto, replacing the string of data elements with a reference to the string of other data elements. The method further comprises transmitting toward the second location the corresponding compressed data packet and a corresponding stream index that is representative of the given location and, for each uncompressed data set of at least some of the number of uncompressed data sets, receiving an acknowledgement signal representative of the corresponding compressed data packet being received at the second location and, responsive thereto, changing in the storage the indication of the number of data elements of the uncompressed data set from having the first status assigned thereto into having the second status assigned thereto.

Another aspect of the disclosed and claimed concept is to provide an improved method of communicating at least a portion of a data stream between a first location and a second location. The method can be generally stated as including, for each uncompressed data set of a number of uncompressed data sets of the data stream, sequentially storing in a storage a number of data elements of the uncompressed data set, a first data element of the number of data elements being stored at a given location in the storage, storing in the storage an indication that the number of data elements each have a first status assigned thereto, subjecting the number of data elements to a data compression routine to form from the uncompressed data set a corresponding compressed data packet, which can be generally stated as including determining that another string of data elements of the number of data elements is identical to a further string of data elements of the number of data elements and, responsive thereto, replacing one of the another string and the further string with a reference to the other of the another string and the further string. The method further comprises transmitting toward the second location the corresponding compressed data packet and a corresponding stream index that is representative of the given location and, for each uncompressed data set of at least some of the number of uncompressed data sets, receiving an acknowledgement signal representative of the corresponding compressed data packet being received at the second location and, responsive thereto, changing in the storage the indication of the number of data elements of the uncompressed data set from having the first status assigned thereto into having the second status assigned thereto.

Another aspect of the disclosed and claimed concept is to provide an improved data communication apparatus that is structured to communicate at least a portion of a data stream between a first location and a second location. The data communication apparatus can be generally stated as including a hardware apparatus that can be generally stated as including a processor apparatus comprising a processor and a storage, an input apparatus structured to provide input signals to the processor apparatus, and an output apparatus structured to receive output signals from the processor apparatus, the storage having stored therein a number of routines which, when executed on the processor, cause the hardware apparatus to perform operations that can be generally stated as including, for each uncompressed data set of a number of uncompressed data sets of the data stream, sequentially storing in the storage a number of data elements of the uncompressed data set, a first data element of the number of data elements being stored at a given location in the storage, storing in the storage an indication that the number of data elements each have a first status assigned thereto, subjecting the number of data elements to a data compression routine to form from the uncompressed data set a corresponding compressed data packet, which can be generally stated as including determining that a string of data elements of the number of data elements is identical to a string of other data elements of the data stream that are stored in the storage and to which a second status has been assigned and, responsive thereto, replacing the string of data elements with a reference to the string of other data elements. The method further comprises transmitting toward the second location the corresponding compressed data packet and a corresponding stream index that is representative of the given location and, for each uncompressed data set of at least some of the number of uncompressed data sets, receiving an acknowledgement signal representative of the corresponding compressed data packet being received at the second location and, responsive thereto, changing in the storage the indication of the number of data elements of the uncompressed data set from having the first status assigned thereto into having the second status assigned thereto.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
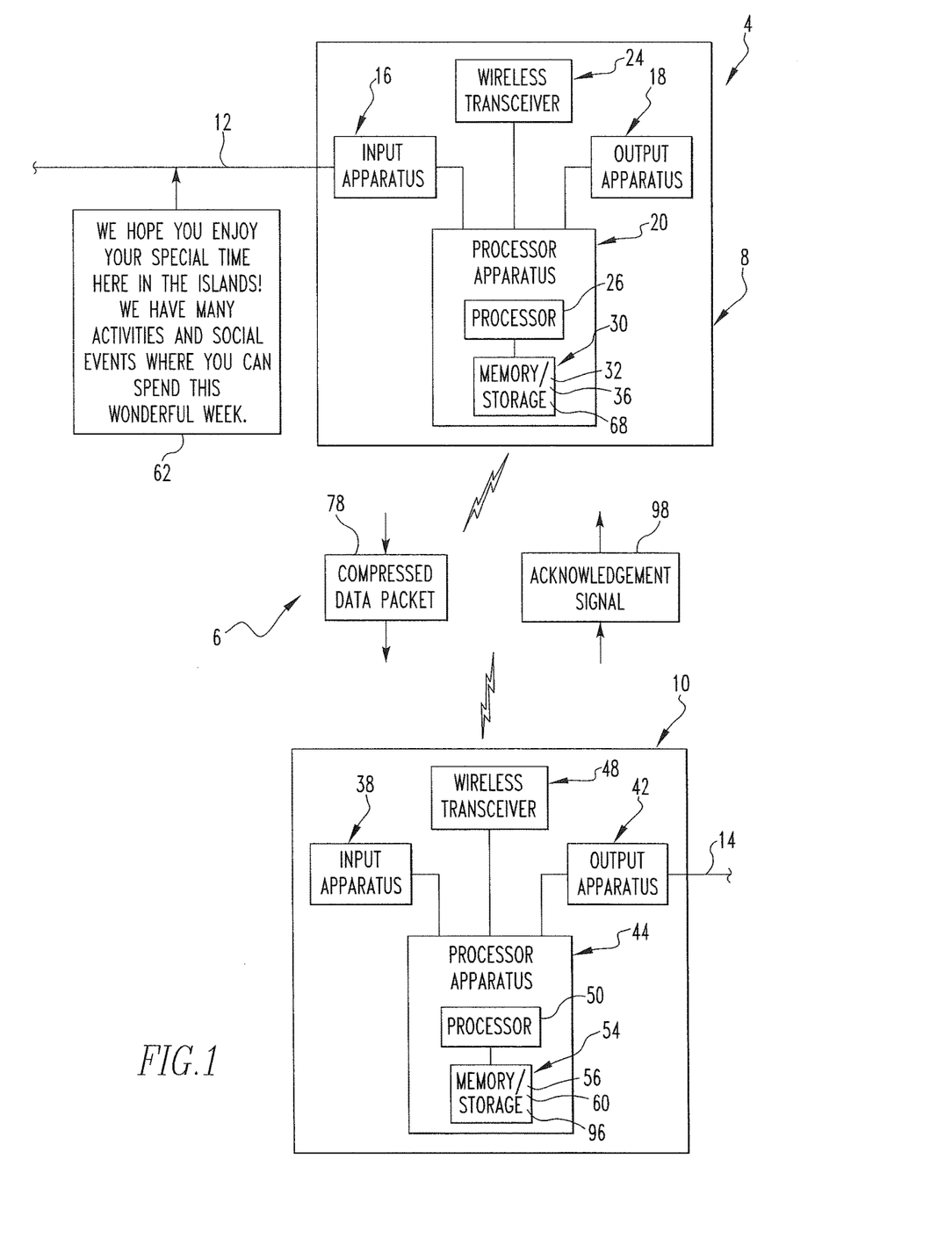
FIG. 1 is a schematic depiction of an improved data communication apparatus in accordance with the disclosed and claimed concept.

An improved data communication apparatus 4 is depicted generally in FIG. 1. The data communication apparatus 4 can be said to include a hardware apparatus 6 that includes a compression apparatus 8 and a decompression apparatus 10. The data communication apparatus 4 further includes an input data stream 12 that is in electronic communication with the compression apparatus 8 and an output data stream 14 that is in electronic communication with the decompression apparatus 10. As used herein, the expression "compression" and "decompression" shall refer generally to operations that compact and expand portions of a data stream for use in reducing the bandwidth of data that is communicated between two different locations.

The compression apparatus 8 can be generally described as including an input apparatus 16, an output apparatus 18, and a processor apparatus 20. The compression apparatus 8 further includes a transceiver which, in the depicted exemplary embodiment, is a wireless transceiver 24 that can be said to include a reception component that is a part of the input apparatus 16 and to further include a transmission component that is a part of the output apparatus 18.

The processor apparatus 20 can be said to include a processor 26 and a memory 30 in operative communication with one another. The processor 26 can be any of a wide variety of data processors, and the memory 30 can be any of a wide variety of types of data storage that include RANI, ROM, EPROM, EEPROM, FLASH, and the like without limitation. The memory 30 has stored therein a number of routines 32 that expressly include a compression routine 32 having an algorithm that performs data compression operations and other operations. As employed herein, the expression "a number of" shall refer broadly to any non-zero quantity, including a quantity of one. The routines 32 can be executed on the processor 26 to cause the compression apparatus 8 to perform various operations. A portion of the memory 30 is designated as a storage array 36 within which a compression-side dictionary 68 is stored.

The decompression apparatus 10 likewise includes an input apparatus 38, an output apparatus 42, a processor apparatus 44, and a transceiver which, in the depicted exemplary embodiment, is a wireless transceiver 48, with the wireless transceiver 48 having reception and transmission components that can be considered to be a part of the input and output apparatuses 38 and 42, respectively. The processor apparatus 44 includes a processor 50 and a memory 54 having a number of routines 56 stored therein, expressly including a decompression routine 56. A portion of the memory 54 is designated as a storage array 60 which is intended to have stored therein a decompression-side dictionary 96 that is, at least in part, a mirror of the compression-side dictionary 68.

The wireless transceivers 24 and 48 provide a data link between the compression apparatus 8 and the decompression apparatus 10. In the depicted exemplary embodiment the data link is wireless in nature. It is expressly noted, however, that the data link could instead be a wired data link while still embodying the teachings presented herein and while still being within the scope of the present concept.

An example data stream 62 is depicted in FIG. 1 as being communicated via the input data stream 12 to the compression apparatus 8. The data stream 62 is in the exemplary form of text formed from Latin letters, but it is understood that the data stream 62 could take any form without departing from the present concept. As will be set forth in greater detail below, the data stream 62 is processed by the routines 32 to form a number of uncompressed data sets 66 that are stored in the storage array 36 as the compression-side dictionary 68. While in the exemplary depicted embodiment almost all uncompressed data sets 66 are twenty-four characters in length, this is only for the purposes of explanation, and there is no requirement for all uncompressed data sets 66 to be of any particular length or of equal lengths, and uncompressed data sets 66 can be of any length that is supported by the underlying data transmission method.

Figure 2A:
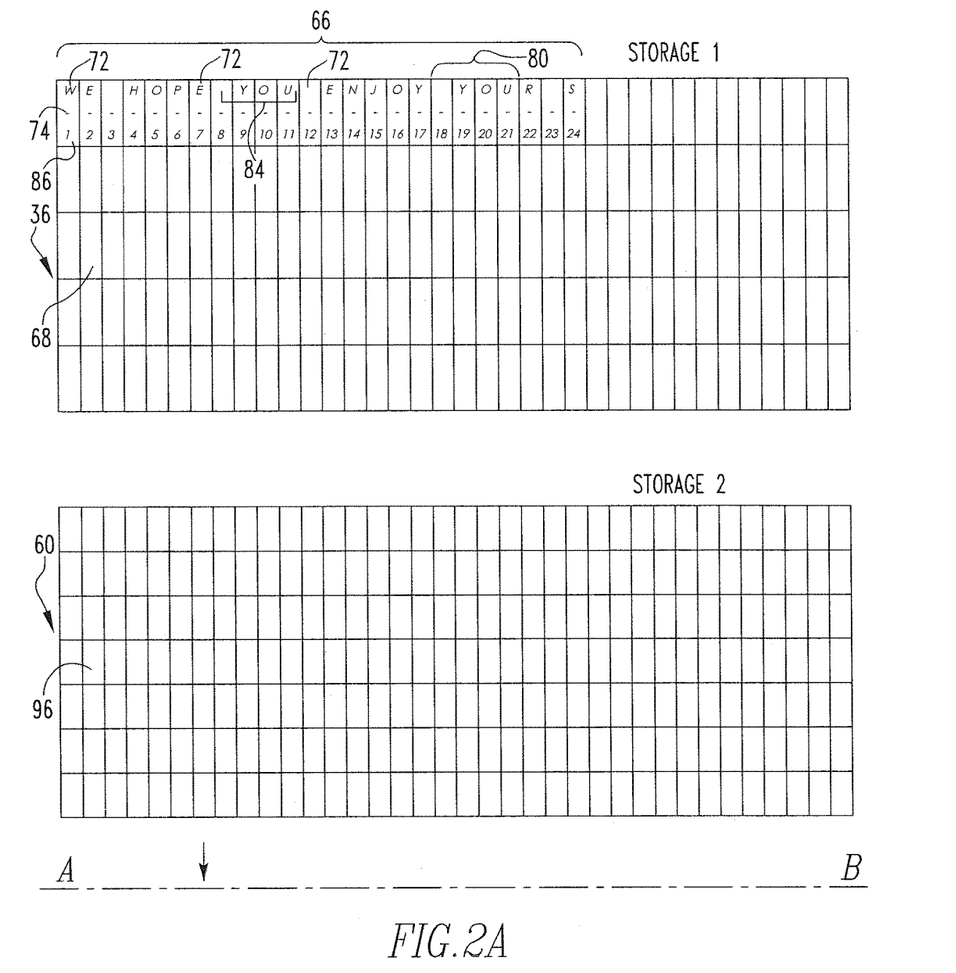
FIG. 2 can be said to comprise FIGS. 2A-H and depicts compression-side and decompression-side storage arrays that contain dictionaries that change throughout FIGS. 2A-H responsive to various occurrences.

As can be seen in FIG. 2A, the first uncompressed data set 66 formed from the data stream 62 includes twenty-four data elements 72 that are stored in an equal number of storage locations which, for reasons of simplicity of disclosure, are numbered 1-24. Each data element 72 in the compression-side dictionary 68 further has a status indicator 74 associated therewith that provides an indication of whether the data element 72 is considered to be "invalid" or "valid" for purposes of use in the compression of future uncompressed data sets 66. An invalid status is indicated by a mathematical minus sign ("−") and indicates that the corresponding data element 72 is unusable to compress another uncompressed data set 66. In contrast, a "valid" status is represented by a plus sign ("+") and indicates that the corresponding data element 72 can be used in compressing future uncompressed data sets 66.

While the exemplary data sets 72 are depicted herein as being Latin letters, it is understood that such Latin letters are exemplary only. It is thus understood that the data elements 72 in other embodiments could be other language characters, other types of symbols, data bytes, data bits, and the like without limitation while still remaining within the scope of the present concept.

The compression routine 32 is operable to compress the uncompressed data set 66, such as is depicted generally in FIG. 2A, into a compressed data packet 78 (FIG. 1) that eventually can be transmitted from the wireless transceiver 24 on the compression side to the wireless transceiver 48 on the decompression side to communicate the compressed data packet 78 from the compression apparatus 8 at a first location to the decompression apparatus 10 at a second, different, location. The exemplary compression routine 32 operates by determining whether any given string of data elements 72 that exists sequentially within the uncompressed data set 66 is identical to a previous string of data elements 72 that occurred sequentially prior to, i.e., previously, in the compression-side dictionary 68. This can occur in any of a variety of fashions and can include, for instance, character comparisons, the use of hash tables or search trees, etc., without limitation.

However the searching is performed, compression involves the identification of a target string 80 which, as is depicted in FIG. 2A, is the set of four data elements 72 that are stored in memory locations 18-21. These four data elements 72 (a <SPACE> followed by the letters "YOU") is identical to a reference string 84 that is comprised of the four data elements 72 stored at storage locations 8-11. The exemplary compression routine 32 will replace the four data elements 72 that make up the target string 80 with a reference to the reference string 84. The reference itself will typically include the initial data location which, in this case, is the storage location 8, followed by a length which, in this case, is the quantity four, i.e., the reference to the reference string indicates that the target string 80 has been replaced with the four data elements 72 that begin at the storage location 8. As will be set forth in greater detail below, when the compressed data packet 78 is decompressed by the decompression apparatus 10, the decompression routine 56 will encounter the reference to the reference string 84 and will copy the reference string 84 and insert it at the current location in place of the reference.

The uncompressed data set 66 that is depicted in FIG. 2A has a stream index 86 which, in the depicted exemplary embodiment, is representative of the storage location where the first data element 72 in the uncompressed data set 66 is stored which, in the instant example, is the storage location numbered "1". When the uncompressed data set 66 is compressed into the compressed data packet 78, the stream index 86 is added as a header on the compressed data packet 78. As such, when the compressed data packet 78 is received by the wireless transceiver 48 of the decompression apparatus 10 and is subjected to decompression by the decompression routine 56, the stream index 86 indicates to the decompression routine 56 the location in the storage array 60 where the first data element 72 that is decompressed from the compressed data packet 78 should be placed. Subsequent data elements 72 that are decompressed from the compressed data packet 78 are sequentially stored in successive storage location in the storage array 60. While the stream index 86 that is communicated in the instant example is the digit "1", it need not necessarily be numerical in nature and merely is representative of a storage location. In this regard, it could be of virtually any foam without limitation, as long as the particular form allows references in subsequently transmitted compressed data packets 78 to refer to data elements in prior uncompressed data sets 66 as stored in the storage array 60.

As can be understood from FIG. 2B-2H, the storage array 60 includes a plurality of numbered storage locations into which data elements 92 can be stored to form a mirror 94 at the decompression side of the uncompressed data set 68 that is stored in the storage array 36 at the compression side. The various mirrors 94 of the various uncompressed data sets 66 together faun in the storage array 60 the decompression-side dictionary 96 which ultimately will be the same as the compression-side dictionary 68 if it is assumed that all compressed data packets 78 that are transmitted by the wireless transceiver 24 on the compression side are received by the wireless transceiver 48 on the decompression side, as will be set forth in greater detail below.

When any given compressed data packet 78 is received on the decompression side by the wireless transceiver 48 and is decompressed by the decompression routine 56, an acknowledgement signal 98 is transmitted by the wireless transceiver 48 from the decompression side to the wireless transceiver 24 on the compression side to acknowledge receipt of the compressed data packet 78. The various acknowledgement signals 98 are designated herein as <ACK1>, <ACK2>, <ACK3>, etc. to represent the first, second, and third compressed data packets 78 that are described herein as being transmitted by the wireless transceiver 24, as will be set forth in greater detail below, it being understood that the numerals 1, 2, and 3 are intended merely to refer to a sequence of transmission for the sake of simplicity of disclosure. In the depicted exemplary embodiment, the acknowledgement signal 98 of any given compressed data packet 78 includes the corresponding stream index 86, i.e., the stream index of the uncompressed data set 66 that was represented by the compressed data packet 78 that was acknowledged by the wireless transceiver 48. In the depicted exemplary embodiment, the stream index is a sixteen bit value which might be, for example, 1 through 65,536, although it may be more or less than sixteen bits without departing from the present concept. Each exemplary stream index 86 mentioned herein is a relatively modest value, such as 1, 25, 49, 97, and the like for reasons of simplicity of disclosure.

The acknowledgement signal 98 in the depicted exemplary embodiment further includes a signal or value that is representative of the quantity of data elements 92 that were decompressed from the received compressed data packet 78. The quantity of data elements reflected in the acknowledgement signal 98 should be equal to the quantity of data elements in the corresponding uncompressed data set 66. Alternatively, the acknowledgement signal 98 may identify the compressed data packet 78 to which it corresponds in some other fashion, and the memory 30 may have stored therein data associated with each uncompressed data set 66 that includes the corresponding stored string index 86 and its corresponding quantity of data elements. This may be used if it is desired not to transmit this particular information as a part of the acknowledgement signal 98.

Figure 2B:
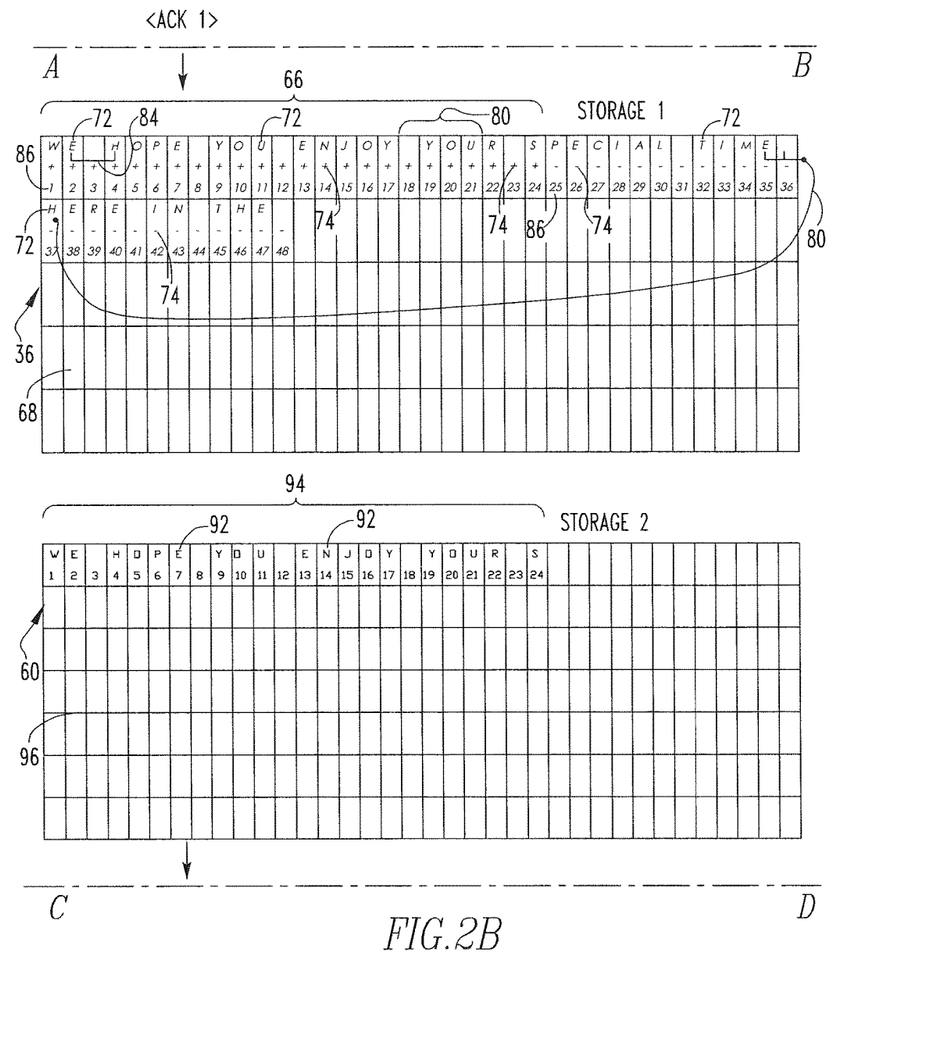

Upon receipt of the acknowledgement signal 98 at the compression side by the wireless transceiver 24, the data elements 72 in the storage array 60 that had been represented by the acknowledged compressed data packet 78 are altered by the routines 32 change their status indicator 74 from "invalid" to "valid". This is depicted in FIGS. 2A-2B with the minus symbol ("−") of certain data elements 72 being changed to a plus symbol ("+"). As suggested elsewhere herein, a data element 72 that is of a "valid" status is usable as a part of a reference string 84 during the compression of other uncompressed data sets 66.

It is noted that when any given uncompressed data set 66 is undergoing compression with the compression routine 32, the various data elements 72 within the particular uncompressed data set 66 are usable to compress other portions of the same uncompressed data set 66. For instance, the first uncompressed data set 66 is depicted herein as being stored at the storage locations 1-24. The aforementioned target string 80 that is depicted in FIG. 2A as being the data elements 72 stored at storage locations 18-21 and the reference string 84 in FIG. 2 that includes the data elements 72 stored at storage locations 8-11 are identical in the uncompressed data set 66. It thus can be seen that despite the "invalid" status indicators 74 that are indicated for each of the data elements 72 in that uncompressed data set 66, this does not prevent the various data elements 72 from being used to compress other portions of the same uncompressed data set 66, which provides enhanced compression.

Some examples of compression and decompression are set forth below. FIG. 2A depicts as the first uncompressed data set 66 the first twenty-four letters of the data stream 62 stored in storage locations 1-24. As mentioned above, the first data element 72 of the uncompressed data set 66 is stored at storage location 1, and the corresponding stream index 86 thus is likewise representative of the value "1". The storage array 60 is represented as being completely empty and is representative of the first compressed data packet 78 not yet having been received on the decompression side.

The data elements 72 of the first uncompressed data set 66 which are stored in storage locations 1-24 each have an "invalid" status indicator 74 associated therewith. This indicates that an acknowledgement signal 98 that would correspond with the uncompressed data set 66 has not yet been received by the wireless transceiver 24. In this regard, it is noted that the various conditions of the storage array 36 that are depicted herein are not intended to reflect whether the corresponding compressed data packets 78 have actually been transmitted by the wireless transceiver 24, but rather are intended to demonstrate the fact that the various data elements 72 have been loaded into the storage array 36. This is regardless of whether such data elements 72 have been compressed into compressed data packets 78 and likewise regardless of whether any such compressed data packets 78 have been transmitted by the wireless transceiver 24.

FIG. 2B first demonstrates the receipt of the acknowledgement signal 98 "<ACK1>", which corresponds with the uncompressed data set 66 stored at storage locations 1-24, being received by the wireless transceiver 24 from the wireless transceiver 48. As a result, the data elements 72 stored at storage locations 1-24 have had their status indicator 74 changed from "invalid" to "valid". Moreover, FIG. 2B depicts that storage array 60 has received the same twenty-four data elements 92 that are stored in storage locations 1-24. It thus can be understood that since the data elements 72 that are stored in storage locations 1-24 in the storage array 36 are mirrored at storage locations 1-24 in the storage array 60, any reference from this time onward in a compressed data packet 78 to a reference string 84 in any one or more of storage locations 1-24 could be found in a mirror fashion in the corresponding storage locations 1-24 in the storage array 60. As such, the data elements 72 at storage locations 1-24 in the storage array 36 would be appropriate for use in compression of other future uncompressed data sets 66, hence the change in the status indicator 74 of the data elements 72 stored at storage locations 1-24 in the storage array 36 from "invalid" to "valid".

FIG. 2B also depicts that another uncompressed data set 66 of data elements 72 has been loaded into storage locations 25-48 in the storage array 36. Again, FIG. 2B does not reflect whether or not the second uncompressed data set 66 at storage locations 25-48 has been compressed or whether or not it has been transmitted as a compressed data packet 78 by the wireless transceiver 24, but rather is intended to depict the fact that the data elements 72 of the second uncompressed data set 66 are stored in storage locations 25-48 and have each been given a status indicator 74 that is "invalid" because no acknowledgement signal 98 that corresponds with the second uncompressed data set 66 has been received by the wireless transceiver 24.

Figure 2C:
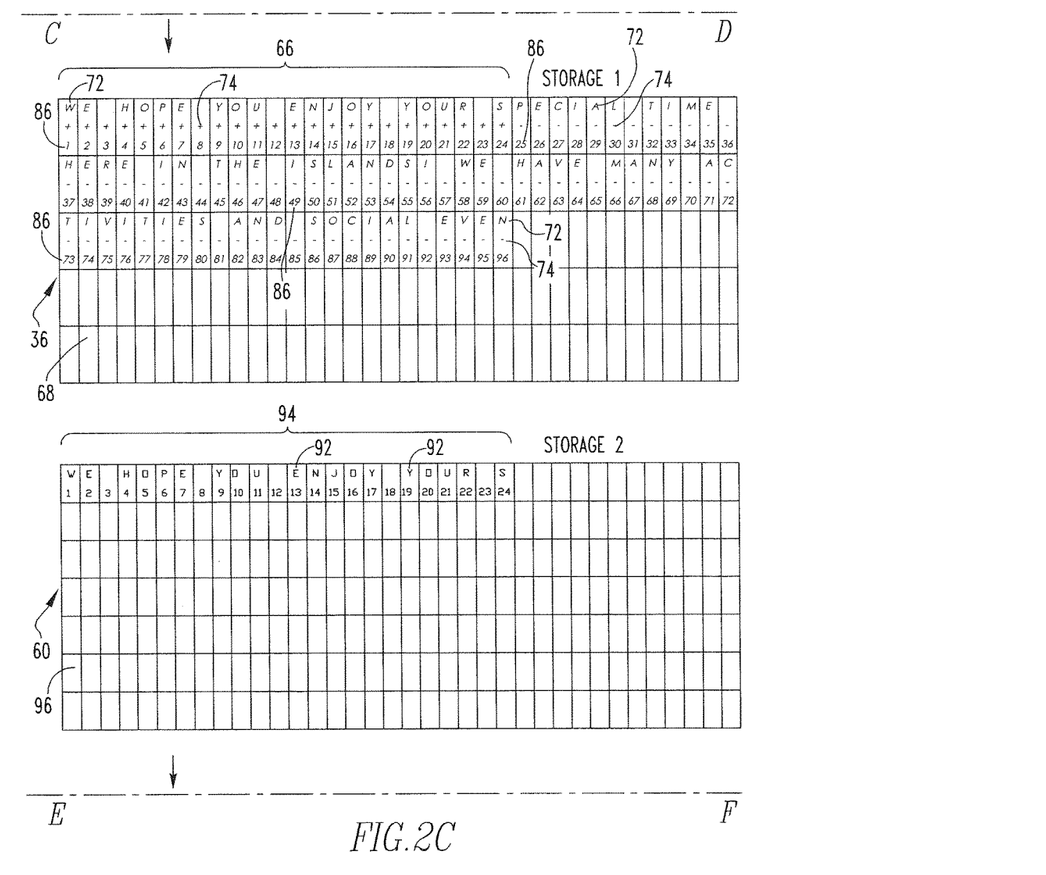

FIG. 2C depicts another a third uncompressed data set 66 and a fourth uncompressed data set 66 being stored at storage locations 49-72 and 73-96, respectively, in the storage array 36, and all such data elements have received a status indicator 74 of "invalid" as is indicated by the "minus symbol" associated with each of the data elements 72 in storage locations 49-96. In the example depicted in FIG. 2C, the four uncompressed data sets 66 sequentially span storage locations 1-96, but an acknowledgement signal 98 has been received only for the first compressed data packet 78, as was indicated at the top of FIG. 2B.

Figure 2D:
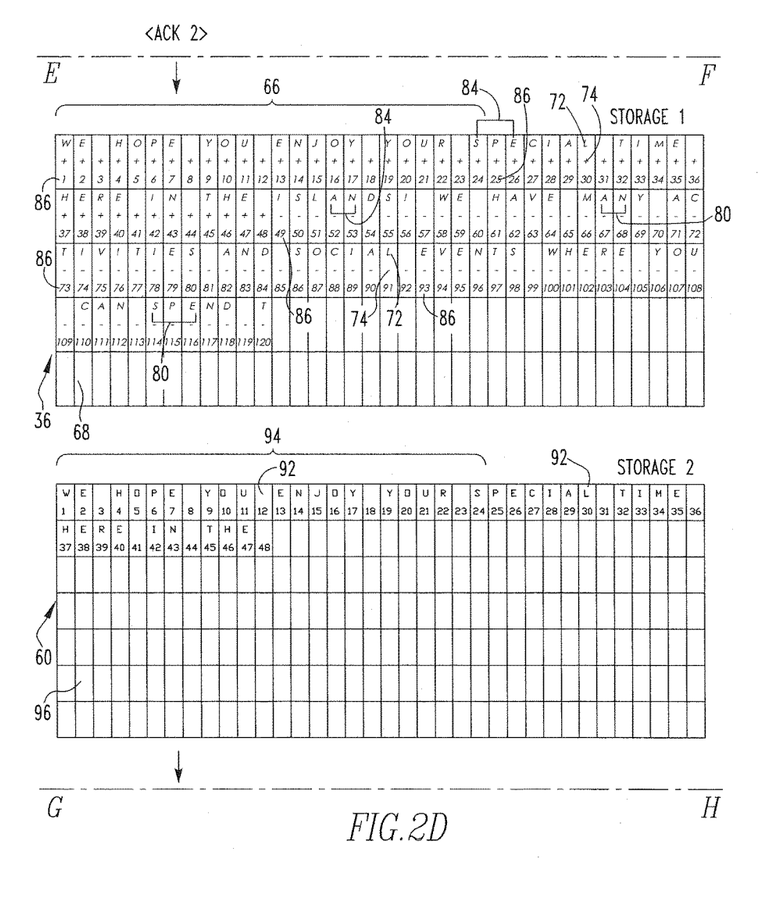

At the top of FIG. 2D, it can be seen that an acknowledgement signal 98 "<ACK2>" has been received in respect of the second uncompressed set 66, i.e., the one whose data elements 72 span storage locations 25-48 of the storage array 36, and such data elements 72 thus have had their status indicator 74 changed from "invalid" to "valid", i.e., from "−" to "+". Likewise, the corresponding mirrors 94 of the first and second uncompressed sets 66 include data elements 92 stored in storage locations 1-48 in the storage array 60. In this regard, the second uncompressed data set 66 would have had as its stream index 86 the numeral "25". As such, when the compressed data packet 78 that corresponded with such second uncompressed data set 66 was received by the wireless transceiver 48, the stream index 86 with the value "25" had indicated to the decompression routine 56 the particular storage location in the storage array 60 where the first data element 92 of the mirror 94 of the second uncompressed data set 66 would be stored and after which the successive data elements 92 would be sequentially stored. FIG. 2D further indicates that a fifth uncompressed data set 66 has been stored in the storage array 36 at the storage locations 97-120 and that such new data elements 72 have received a status indicator 74 of "invalid".

Figure 2E:
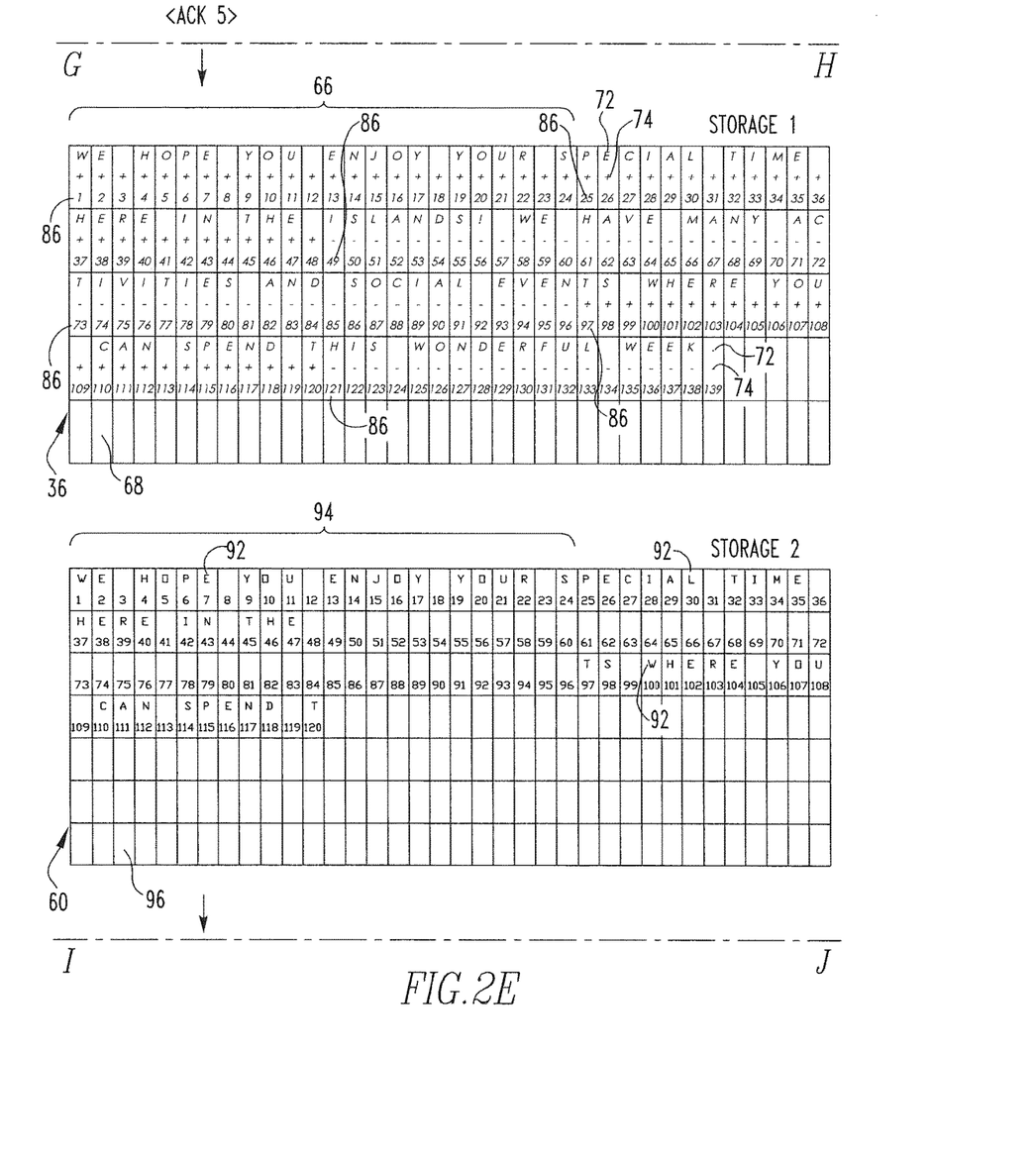

At the top of FIG. 2E, it can be seen that an acknowledgement signal 98 "<ACK5>" for the fifth uncompressed data set 66 has been received by the wireless transceiver 48. As such, the routines 32 have changed the status indicator 74 from "invalid" to "valid" for the corresponding data elements 72, which are stored at storage locations 97-120. FIG. 2E further indicates that a sixth uncompressed data set 66 has been added to the storage array 36 in storage locations 121-139, and that such new data elements have a status indicator 74 that is "invalid".

FIG. 2E additionally indicates that the data elements 92 that correspond with the fifth uncompressed data set 66 have been stored at storage locations 97-120 in the storage array 60. As can be understood from FIGS. 2D and 2E, the stream index 86 of the fifth uncompressed data set 66, which is the location in the storage array 36 where the first data element 72 of the fifth uncompressed data set 66 is stored, corresponds with a value of "97". As such, the decompression routine 56 in the process of decompressing the fifth compressed data packet 78 would have encountered its stream index 86 having a value of "97" and thus would have skipped over storage locations 49-96 in order to store the first data element 92 of the decompressed fifth mirror 94 at storage location 97 in the storage array 60. Subsequent data elements 92 were sequentially stored in successive storage locations. As such, the data element 92 stored at storage location 47 in the storage array 60 is spaced from the data element 92 at the storage location 97 therein. Nevertheless, any instruction by the decompression routine 56 to traverse from within the fifth mirror 94 at storage locations 97-120 to a location the first or second mirrors (i.e., somewhere among storage locations 1 and 48) could be validly executed in order to find reference strings 84 as needed. It also can be seen that the corresponding data elements 72 stored in storage locations 1-48 and 97-120 of the storage array 36 all possess a status indictor 74 that is "valid" in FIG. 2E.

Figure 2F:
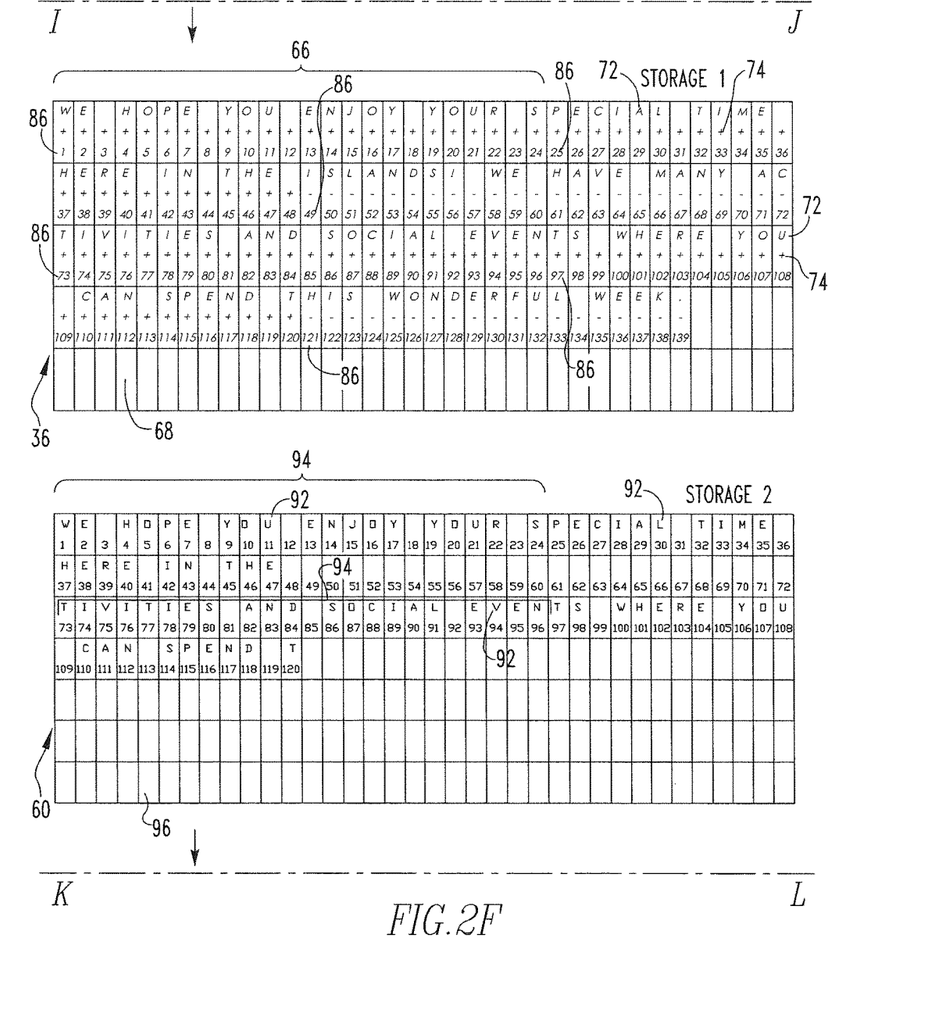

As can be seen in FIG. 2F, an acknowledgement signal 98 "<ACK4>" has been received in respect of the compressed data packet 78 that corresponds with the fourth uncompressed data packet 66, i.e., the one whose data elements 72 are stored in storage locations 73-96. As such, the data elements 72 stored at storage locations 73-96 have had their status indicator 74 changed from "invalid" to "valid". Likewise, storage locations 73-96 in the storage array are no longer blank and rather have data elements 92 stored therein that correspond with the received and decompressed fourth compressed data packet 78, and which resulted from receipt of the compressed data packet 78 that corresponds with the fourth uncompressed data set 66. In this regard, it can be understood that the stream index 86 that corresponded with the fourth uncompressed data set 66 was representative of the value "73" since the first data element 72 thereof is stored at storage location 73 in the storage array 36, and the decompression routine 56 thus stored at the storage location 73 in the storage array 60 the first data element 92 that was decompressed from the fourth compressed data packet 78. Successive data elements 92 were successively stored in storage locations 74-96 whereby the fourth and fifth mirrors 94 are adjacent one another at storage locations 96 and 97 in the storage array 60.

Figure 2G:
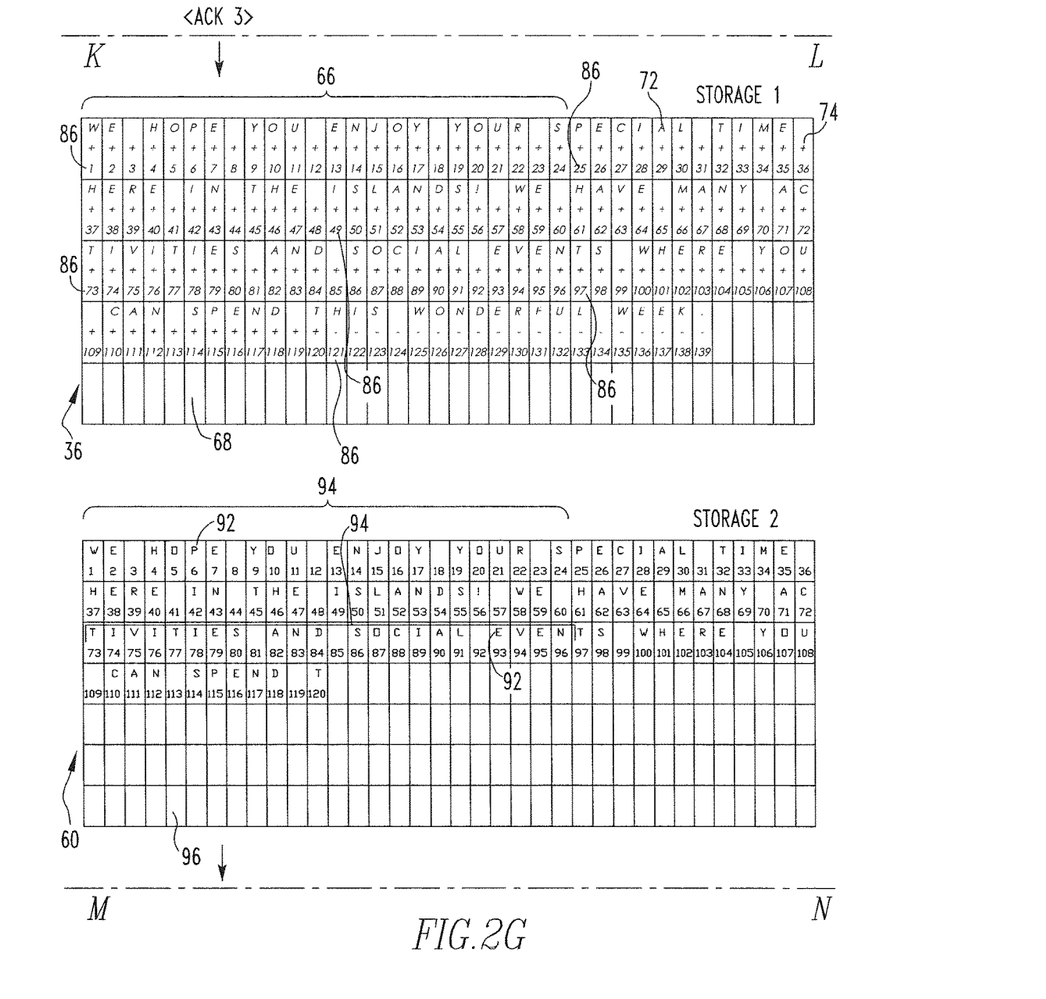

FIG. 2G demonstrates that an acknowledgement signal 98 "<ACK3>" has been received in respect of the compressed data packet 78 that corresponded with the third uncompressed data sets 66 whose data elements 72 are stored in the storage locations 49-72. As such, these data elements 72 have had their status indictor 74 changed from "invalid" to "valid". FIG. 2G further indicates that the storage locations 49-72 in the storage array 60 now have data elements 92 stored therein that correspond with the third uncompressed data set 66 and that form a third mirror 94 thereof. As can be understood, the stream index 86 of the third uncompressed data set 66 would be representative of the value "49" based upon the first data element 72 of the third uncompressed data set 66 being stored at storage location 49 in the storage array 36, which would have indicated to the decompression routine 56 the storage location the first data element 92 of the third mirror 94 should be stored at the storage location 49 in the storage array 60.

Figure 2H:
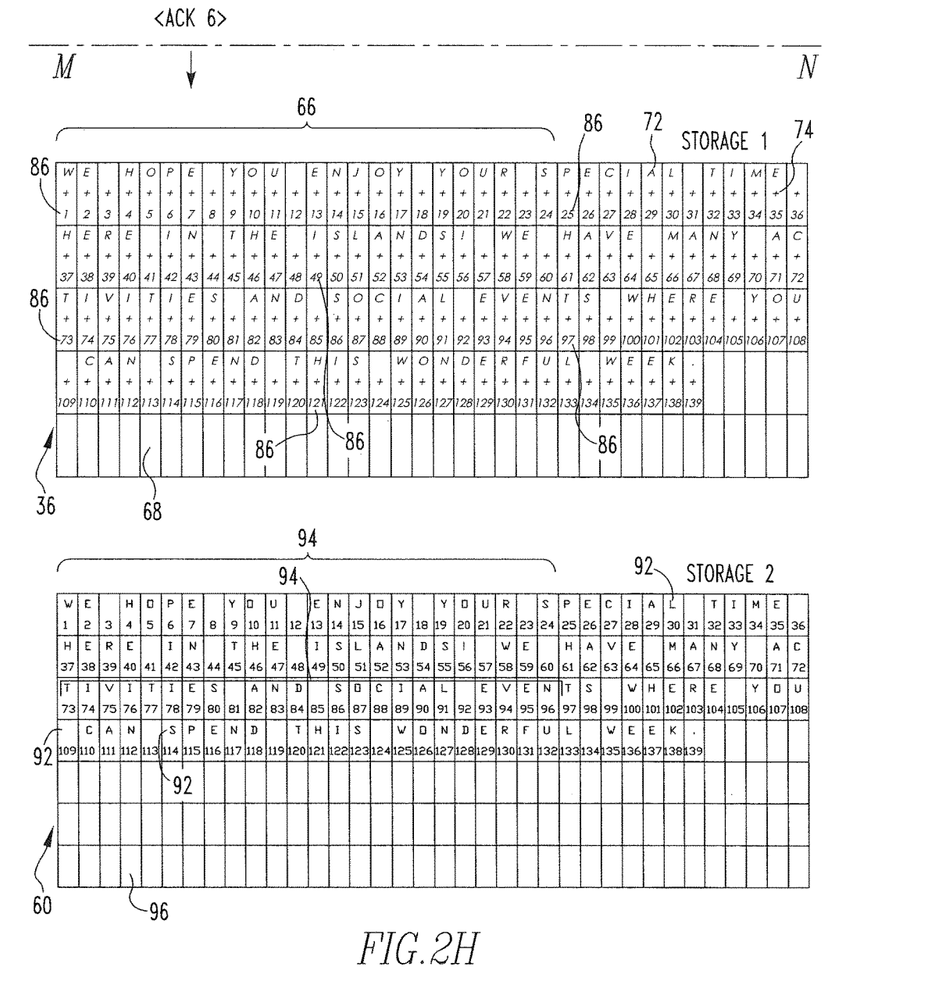

FIG. 2H depicts the receipt by the wireless transceiver 24 of an acknowledgement signal 98 "<ACK6>" in respect of the sixth uncompressed data set 66 whose data elements 72 are stored at storage locations 121-139 in the storage array 36. The corresponding status indicators 74 of such data elements 72 have been changed from "invalid" to "valid". Corresponding data elements 92 have been added to storage array 60 at storage locations 121-139 based upon the stream index 86 of the sixth uncompressed data set 66 being representative of the value "121" for reasons that will be apparent.

With reference to FIGS. 2A-2H, and particularly with respect to FIG. 2B, the data elements 72 stored at storage locations 35-37 in the storage array 36 could be considered to be another target string 80 that is identical to the data elements 72 stored at storage locations 2-4 in the storage array 36. Since the data elements 72 stored at storage locations 2-4 in the storage array 36 each have a status indicator 74 that is "valid", such string of data elements 72 could be a reference string 84 for the aforementioned target string 80. It is reiterated that FIG. 2B and the other figures presented herein depict storage in the storage arrays 36 and 60 and do not necessarily reflect any particular time at which the contents of the storage array 36 may be compressed by the compression routine 32 or transmitted as a compressed data packet 78 by the wireless transceiver 24.

As can be understood from FIG. 2E, however, that the acknowledgement signal 98 "<ACK5>" was received prior to receiving any acknowledgement of the receipt of the third and fourth uncompressed data sets 66 that are stored in storage locations 49-96 in storage array 36, and it is assumed that the first, second, third, fourth, fifth, and sixth uncompressed data sets 66 were compressed by the compression routine 32 in sequential order. It is apparent from FIG. 2E, therefore, that the data elements 72 of the third uncompressed data set stored in storage locations 49-72 could not have been used (as in FIG. 2D) as a reference string when the data elements 72 of the fourth uncompressed data set 66 stored at storage locations 73-96 were compressed. As such, while the reference string 84 stored at storage locations 52-53 "AN" could have been employed to compress the identical target string 80 "AN" stored at storage locations 67-68 in the storage array 36 since they were both in the same uncompressed data set 66, such reference string 84 at storage locations 52-53 could not have been employed to compress the potential target string "AN" at storage locations 82-83 in the storage array 36 of the fourth uncompressed data set 66 since the two are separate uncompressed data sets 66.

It is additionally noted from FIG. 2D that the data elements 72 in the first and second uncompressed data sets 66 that are stored at storage locations 1-48 in the storage array 36 had a status indicator 74 that was "valid", and the string of data elements 72 stored at storage locations 24-26 "SPE" would have served as a reference string 84 when the target string 80 "SPE" made up of the character string stored at storage locations 114-116 in the fifth uncompressed data set 66 were being compressed. In this regard, it is expressly noted that the indicated reference string 84 at storage locations 24-26 spans two uncompressed data sets 66, i.e., the first and second. Since the stream index 86 enables sequential storage of data elements 72 and 92, the various data elements 72 lose any identity as being from a particular uncompressed data set 66 once their status indicator 74 has been changed from "invalid" to "valid". Other target strings 80 and reference strings 84 may be found in the data stream 62 without departing from the present concept.

When the storage arrays 36 and 60 have reached their capacity, the routines 32 and 56 do not simply erase or save elsewhere the contents of the storage arrays 36 and 60. Rather, the storage arrays 36 and 60 are successively overwritten with new data elements 72 and 92 beginning at the storage locations 1 and progressing sequentially onward from there.

The reference itself that refers to the reference string 84 can be in any of a wide variety of forms. In one form, the reference might include an offset value and a length, with the offset value being representative of both a relative location in the storage array 36 that is situated a number of data elements 72 prior to the target string 80 as well as a relative location in the storage array 60 that is situated an equal number of data elements 92 prior to a current location in the storage array 60 where the reference is encountered. The offset can span multiple uncompressed data sets 66 and multiple corresponding mirrors 94 (or portions of the storage array 60 that are empty) and can even restart itself at the end of the storage arrays 36 and 60 if the offset would extend beyond the initial storage location 1 in the storage arrays 36 and 60, at which point the offset would restart at the end of the storage arrays 36 and 60 and continue onward therefrom.

The length in the reference would be representative of the quantity of data elements (beginning at the obtained offset) that are to be retrieved and saved at the current location in the storage array 60 where the reference has been encountered. Other methodologies of providing a reference can be employed without departing from the present concept.

Figure 3:
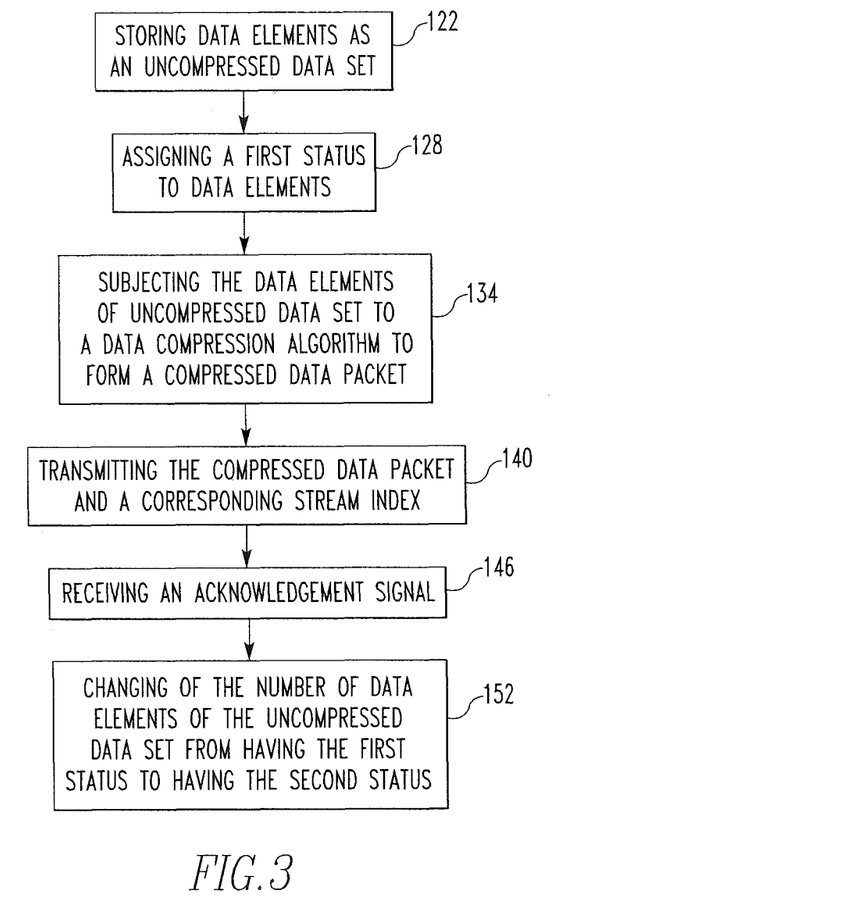
FIG. 3 is an exemplary flowchart depicting certain aspects of an improved invention in accordance with the disclosed and claimed concept.

An improved method in accordance with the disclosed and claimed concept is depicted generally in FIG. 3 and begins with the storing of the data elements 72 in the storage array 36 as an uncompressed data set 66, as at 122. An invalid status is assigned to the data elements 72, as at 128. The data elements 72 of the uncompressed data set 66 are subjected to a data compression routine 32 to form a compressed data packet 78, as at 134. The compressed data packet 78, including a corresponding stream index 86, is transmitted toward the wireless transceiver 48, as at 140. An acknowledgement signal 98 is received, as at 146, at the wireless transceiver 24, which results in the changing of the data elements 72 of the acknowledged uncompressed data set 66 from the "invalid" status to the "valid" status, as at 152.

The disclosed and claimed concept thus provides an improved method and apparatus for providing compression/decompression data transfer. It does so in a fashion that does not require significant additional memory or transmission overhead and thus is highly advantageous.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of communicating at least a portion of a data stream between a first location and a second location, comprising:

for each uncompressed data set of a number of uncompressed data sets of the data stream:
sequentially storing in a storage a number of data elements of the uncompressed data set, a first data element of the number of data elements being stored at a given location in the storage;
storing in the storage an indication that the number of data elements each have a first status assigned thereto;
subjecting the number of data elements to a data compression routine to form from the uncompressed data set a corresponding compressed data packet, comprising determining that a string of data elements of the number of data elements is identical to a string of other data elements of the data stream that are stored in the storage and to which a second status has been assigned and, responsive thereto, replacing the string of data elements with a reference to the string of other data elements; and transmitting toward the second location the corresponding compressed data packet and a corresponding stream index that is representative of the given location; and for each uncompressed data set of at least some of the number of uncompressed data sets:

receiving an acknowledgement signal representative of the corresponding compressed data packet being received at the second location and, responsive thereto, changing in the storage the indication of the umber of data elements of the uncompressed data set from having the first status assigned thereto into having the second status assigned thereto.

2. The method of claim 1 wherein the subjecting of the number of data elements to a data compression algorithm further comprises determining that another string of data elements of the number of data elements is identical to a further string of data elements of the number of data elements and, responsive thereto, replacing one of the another string and the further string with a reference to the other of the another string and the further string.

3. The method of claim 1 wherein the changing in the storage of the indication of the number of data elements comprises:

obtaining from at least one of the acknowledgement signal and the storage a signal that is representative of:
the quantity of data elements in the uncompressed data set, and
the corresponding stream index; and changing from the first status to the second status a group of data element in the storage that begin with the corresponding stream index and that are equal in number to the quantity.

4. The method of claim 1, further comprising:

reaching a capacity limit on the storage, and responsive thereto, and beginning with an initial location of the storage, progressively overwriting the storage with a number of data elements of a number of further uncompressed data sets of the number of uncompressed data sets.

5. The method of claim 1, further comprising, for each uncompressed data set of at least some of the number of uncompressed data sets:

receiving the corresponding compressed data packet at the second location;

outputting, the acknowledgement signal;

subjecting the corresponding compressed data packet to a data decompression routine to generate at the second location a mirror of the uncompressed data set;

sequentially storing in another storage another number of data elements of the mirror of the uncompressed data set, a first data element of the another number of data elements being stored at a particular location in the another storage that corresponds with the corresponding stream index.

6. The method of claim 5, further comprising:

at a first time, storing in the another storage the another number of data elements of the mirror, a terminal data element of the another number of data elements being stored at a terminal location in the another storage that corresponds with the corresponding stream index and the quantity of data elements in the mirror; and at a second time subsequent to the first time, storing in the another storage an additional number of data elements of an additional mirror of an additional uncompressed data set, a first data element of the additional number of data elements being stored at an additional particular location in the another storage that corresponds with the corresponding stream index of the additional mirror, the additional particular location being spaced in the another storage from the terminal location.

7. The method of claim 6, further comprising at a third time subsequent to the second time, storing in the another storage a further number of data elements of a further mirror of a further uncompressed data set, a first data element of the further number of data elements being stored at a further particular location in the another storage that is adjacent the terminal location and that corresponds with the corresponding stream index of the further mirror, a terminal data element of the further number of data elements being stored at a location in the another storage that is adjacent the additional particular location and that corresponds with the corresponding stream index of the further mirror and the quantity of data elements of the further mirror.

8. The method of claim 5, further comprising outputting as a part of the acknowledgement signal a signal that is representative of:

the quantity of data elements in the uncompressed data set, and the corresponding stream index.

9. The method of claim 5, further comprising generating as the reference an object that comprises an offset value and a length, the offset value being representative of both:

a relative location in the storage that is situated a certain number of data elements prior to the string of data elements, and a relative location in the another storage that is situated a certain number of data elements prior to a current location in the another storage;

the length being representative of the quantity of data element beginning with the relative location in the another storage which are to be retrieved and saved at the current location in the another storage to recreate the string of data elements in the mirror.

10. The method of claim 9, further comprising retrieving, based at least in part upon the offset value and the length, a group of data elements that span a pair of adjacent uncompressed data sets in the another storage.

11. The method of claim 1 wherein the stream index that corresponds with an uncompressed data set of the data stream is a value that equals the stream index that corresponds with an immediately prior uncompressed data set of the data stream plus the quantity of data elements in the immediately prior uncompressed data set.

12. A data communication apparatus structured to communicate at least a portion of a data stream between a first location and a second location, the data communication apparatus comprising:

a hardware apparatus comprising:

a processor apparatus comprising a processor and a storage, an input apparatus structured to provide input signals to the processor apparatus, and an output apparatus structured to receive output signals from the processor apparatus;

the storage having stored therein a number of routines which, when executed on the processor, cause the hardware apparatus to perform operations comprising:

for each uncompressed data set of a number of uncompressed data sets of the data stream:
  sequentially storing in the storage a number of data elements of the uncompressed data set, a first data element of the number of data elements being stored at a given location in the storage;
  storing in the storage an indication that the number of data elements each have a first status assigned thereto;
  subjecting the number of data elements to a data compression routine to form from the uncompressed data set a corresponding compressed data packet, comprising determining that a string of data elements of the number of data elements is identical to a string of other data elements of the data stream that are stored in the storage and to which a second status has been assigned and, responsive thereto, replacing the string of data elements with a reference to the string of other data elements; and
  transmitting toward the second location the corresponding compressed data packet and a corresponding stream index that is representative of the given location; and
for each uncompressed data set of at least some of the number of uncompressed data sets:
  receiving an acknowledgement signal representative of the corresponding compressed data packet being received at the second location and,
  responsive thereto, changing in the storage the indication of the number of data elements of the uncompressed data set from having the first status assigned thereto into having the second status assigned thereto.

13. The data communication apparatus of claim 12, wherein the hardware apparatus further comprises:
  another processor apparatus comprising another processor and another storage,
  another input apparatus structured to provide input signals to the another processor apparatus, and
  another output apparatus structured to receive output signals from the another processor apparatus;
  the another storage having stored therein another number of routines which, when executed on the another processor, cause the hardware apparatus to perform operations comprising:
  for each uncompressed data set of at least some of the number of uncompressed data sets:
    receiving the corresponding compressed data packet at the second location;
    outputting the acknowledgement signal;
    subjecting the corresponding compressed data packet to a data decompression routine to generate at the second location a mirror of the uncompressed data set;
    sequentially storing in the another storage another number of data elements of the mirror of the uncompressed data set, a first data element of the another number of data elements being stored at a particular location in the another storage that corresponds with the corresponding stream index.

14. A method of communicating at least a portion of a data stream between a first location and a second location, comprising:
for each uncompressed data set of a number of uncompressed data sets of the data stream:
  sequentially storing in a storage a number of data elements of the uncompressed data set, a first data element of the number of data elements being stored at a given location in the storage;
  storing in the storage an indication that the number of data elements each have a first status assigned thereto;
  subjecting the number of data elements to a data compression routine to form from the uncompressed data set a corresponding compressed data packet, comprising determining that another string of data elements of the number of data elements is identical to a further string of data elements of the number of data elements and, responsive thereto, replacing one of the another string and the further string with a reference to the other of the another string and the further string; and
  transmitting toward the second location the corresponding compressed data packet and a corresponding stream index that is representative of the given location; and
for each uncompressed data set of at least some of the number of uncompressed data sets:
  receiving an acknowledgement signal representative of the corresponding compressed data packet being received at the second location and,
  responsive thereto, changing in the storage the indication of the number of data elements of the uncompressed data set from having the first status assigned thereto into having a second status assigned thereto.

* * * * *